(12) United States Patent
Takekuma

(10) Patent No.: US 7,619,260 B2
(45) Date of Patent: Nov. 17, 2009

(54) LIGHT-EMITTING DIODE AND METHOD FOR ITS PRODUCTION

(75) Inventor: Akira Takekuma, Tokyo (JP)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 140 days.

(21) Appl. No.: 11/188,413

(22) Filed: Jul. 25, 2005

(65) Prior Publication Data

US 2006/0033117 A1    Feb. 16, 2006

(30) Foreign Application Priority Data

Aug. 10, 2004    (JP) .............................. 2004-233084

(51) Int. Cl.
*H01L 33/00* (2006.01)
(52) U.S. Cl. .............................. 257/99; 257/81; 257/95; 257/98; 257/100; 257/E33.59; 257/E33.72; 257/E33.75
(58) Field of Classification Search ............. 257/81–84, 257/95, 98–100
See application file for complete search history.

(56) References Cited

U.S. PATENT DOCUMENTS

| | | | |
|---|---|---|---|
| 6,552,368 B2 * | 4/2003 | Tamai et al. .................. 257/98 |
| 6,561,680 B1 * | 5/2003 | Shih ........................... 362/294 |
| 6,864,567 B2 * | 3/2005 | Yu .............................. 257/676 |
| 7,347,603 B2 | 3/2005 | Ikeda et al. |
| 2002/0070387 A1 | 6/2002 | Wang et al. |
| 2002/0158320 A1 * | 10/2002 | Takekuma .................. 257/678 |
| 2002/0175333 A1 * | 11/2002 | Wang ......................... 257/79 |
| 2004/0222502 A1 * | 11/2004 | Hsu ........................... 257/678 |

FOREIGN PATENT DOCUMENTS

| | | |
|---|---|---|
| EP | 0650010 | 4/1995 |
| JP | 6-85328 | * 3/1994 |
| JP | 6-163995 | * 6/1994 |
| JP | 07-211937 | 11/1995 |
| JP | 2003-008070 | 10/2003 |
| JP | 2004/179430 A | 6/2004 |

* cited by examiner

Primary Examiner—A. Sefer

(57) ABSTRACT

A Light-emitting diode which comprises a pair of metal plate leads connected to a light-emitting element. The pair of metal plate leads comprise, at the edges of the metal plates, surface mounting-type connecting parts that connect facing the pads of a circuit substrate. Furthermore, the light-emitting diode comprises a support member that has a part, other than leads, that contacts the circuit substrate so that it can be positioned on the circuit substrate with stability during the reflow process.

7 Claims, 4 Drawing Sheets

(a)

(b)

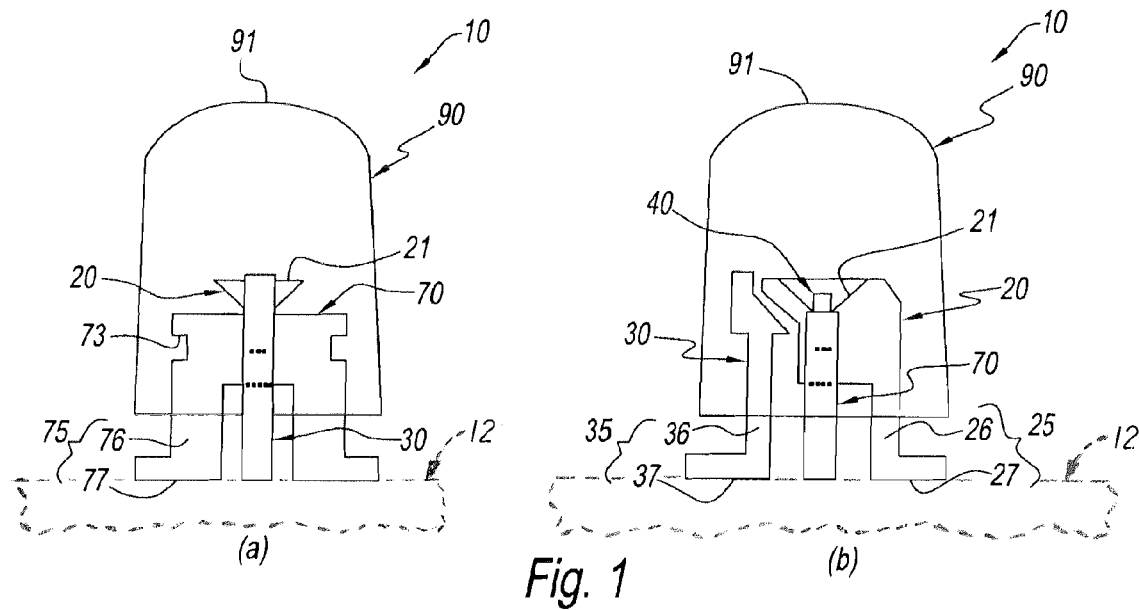
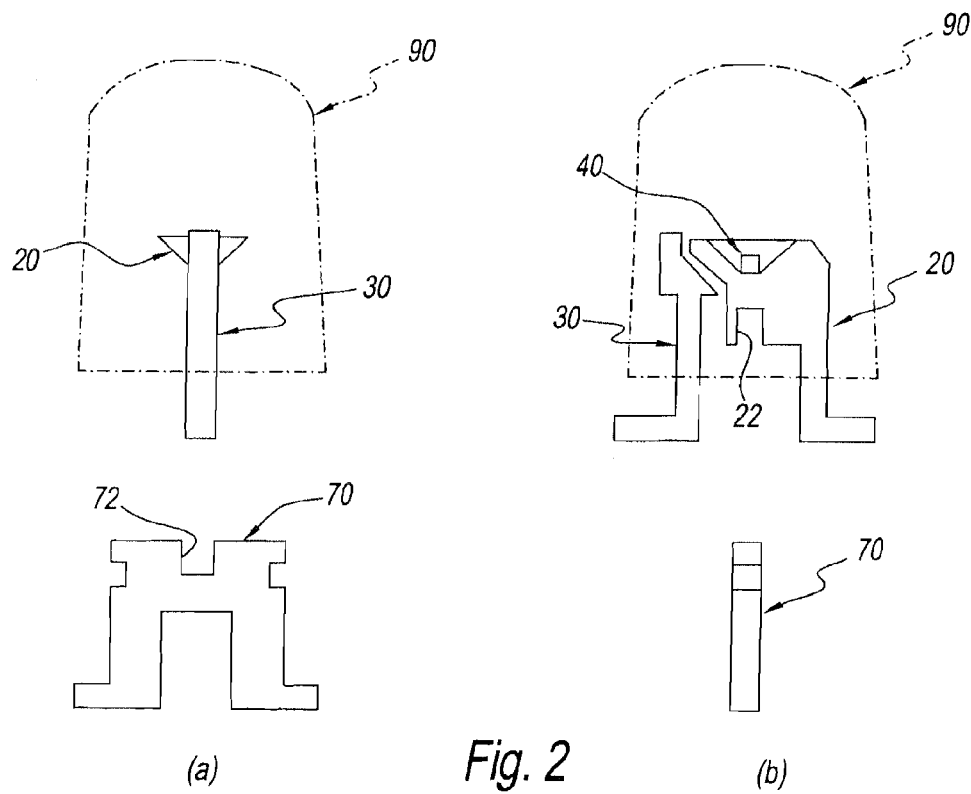
Fig. 1
Fig. 2

LIGHT-EMITTING DIODE AND METHOD FOR ITS PRODUCTION

1. FIELD OF THE INVENTION

The present invention relates to a light-emitting diode that is mounted on a circuit substrate and in particular, to a surface mounting-type (SMT) light-emitting diode that comprises a projectile-type dome part or lens parts.

2. DISCUSSION OF THE BACKGROUND ART

An example of this type of light-emitting diode is a light-emitting diode wherein two or more metal plate leads connected to LED chips (light-emitting elements) are bent along the horizontal folds at the base end of the resin dome part (or the projectile-type lens part) and surface mounting-type connecting parts are made in the plate surface facing the circuit substrate (JP (Kokai) Unexamined Patent Publication 7[1995]-211,937 and JP Unexamined Patent Publication 2003-8070).

The placement and surface area of the plate surface that contacts the circuit substrate are selected so that the light-emitting diode can be supported with stability before being connected by soldering. A variety of angles can be used for the bending angle, with the angle being selected in accordance with the required angle direction of the projectile-type lens parts. Moreover, the leads are not necessarily bent in the same direction; three or more leads can even be mounted on the circuit substrate with stability by bending some leads in a direction opposite that of other leads.

By means of the process for producing this type of light-emitting diode, the leads must be bent after the projectile-type dome parts have been formed. Therefore, there is a problem in that a so-called low-height light-emitting diode with a reduced mounting height cannot be produced.

Furthermore, there is also a problem in that it is difficult to control the lead bending angle and the direction of a mounted dome part cannot be accurately reproduced. In addition, stress is applied to the resin of the dome part as a result of the force applied to the lead during bending, resulting in the possibility of the dome part breaking or the electrical connection between the LED chip and the lead being defective.

SUMMARY OF THE INVENTION

Therefore, an object of the present invention is to provide a surface mounting-type light-emitting diode with projectile-type dome parts that can be easily produced at a low height, and a method for its production.

Another object of the present invention is to provide a light-emitting diode that does not require a bending treatment after the dome part is formed during the production process and therefore there is no detrimental effect on the dome part or on the connecting parts between the leads and the LED chips, and the like.

The present invention provides a light-emitting diode comprising at least a pair (that is, two) metal plate leads connected to light-emitting elements and connecting terminals of surface mounting-type connecting parts at the edges of these metal sheet leads. The light-emitting diode further comprises a supporting member that contacts a mounted circuit substrate and, together with the metal plate leads, supports the light-emitting diode with stability on the circuit substrate before connection by soldering.

In one embodiment, the supporting member is anchored to at least part of the metal plate leads. The supporting member extends in the direction that intersects with the pair of leads to provide proper supporting means at pre-determined positions. Moreover, the supporting member can comprise a mechanical engagement means for aligning the metal plate leads and supporting legs in the direction of height. In this case, the supporting member is made from metal plates and, as with the pair of leads, at the base ends, has surface mounting-type connecting parts for connection to so-called connection pads on a circuit substrate. When light-emitting element is disposed at the top end of one of the leads to which a supporting member is connected, there is an advantage in that the heat generated by the light-emitting elements can escape up away from the circuit substrate.

In another embodiment, the supporting member can be anchored to the base ends of a transparent resin dome part of the light-emitting diode. In this case, the supporting member can be engaged with a mold cup for molding such that this end is prevented from turning during molding of the dome part and are aligned in the direction of height, and then anchored with the dome part that has been molded by resin molding.

The present invention further provides a method for producing a light-emitting diode. The production method comprises a step for forming the lead frame of metal plate leads with surface mounting parts, a step for connecting and disposing light-emitting elements at the top end of the metal plate leads of each unit that forms the light-emitting diode, and a step for forming a resin molded article such that the light-emitting elements are enclosed, and in particular, the step for forming the lead frame includes a step for forming the surface mounting parts at the edges of the metal plate leads, and further comprises a step for joining a supporting member having supporting legs that, together with the metal sheet leads, supports the light-emitting diode on a circuit substrate. It is preferred that the step for joining the supporting member is performed before or simultaneously with the step for forming the resin molded article.

In one embodiment, the process for joining the supporting member comprises a step for joining a supporting member to metal plate leads. In this case, the supporting member is made from metal plates and the step for joining the supporting member can comprise a step for anchoring the supporting member to only one lead of the pair of the metal plate leads where a light-emitting element is disposed in each unit of the lead frame.

In another embodiment, the step for joining the supporting member comprises a step whereby the supporting member is engaged with the molding cup for resin molded articles and the supporting member is anchored by molding of the resin molded article.

BRIEF DESCRIPTION OF THE DRAWINGS

FIG. 1 is a drawing showing a first embodiment of the light-emitting diode of the present invention, and (a) is the front view and (b) is the side view.

FIG. 2 is a drawing showing a first embodiment of the light-emitting embodiment of the present invention with the leads and supporting member separated and the dome part in position, and (a) is the front view and (b) is the side view.

DETAILED DESCRIPTION OF THE PREFERRED EMBODIMENT

Figure 3:
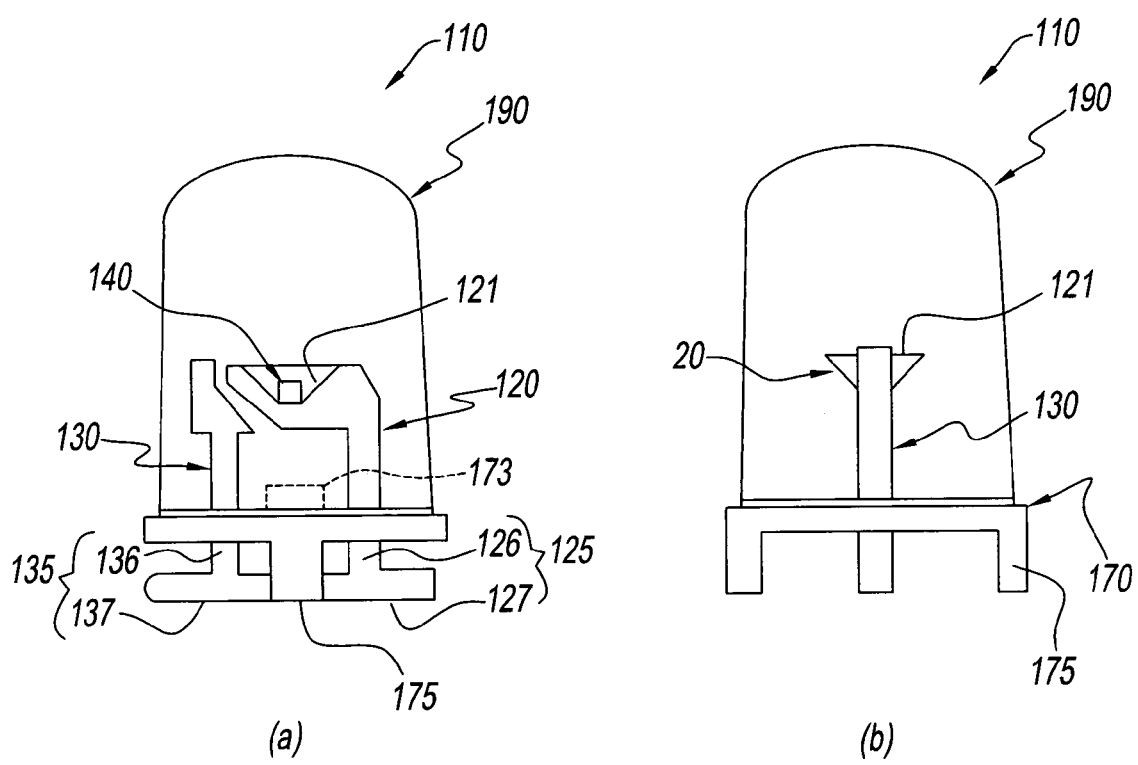
FIG. 3 is a drawing showing a second embodiment of the light-emitting embodiment of the present invention, and (a) is the front view and (b) is the side view.

Preferred embodiments of the light-emitting diode and the method for its production will be described in detail while referring to the attached drawings.

FIGS. 1 and 2 are drawings showing a first preferred embodiment of the light-emitting diode of the present invention. FIG. 1 shows a completed light-emitting diode, and FIG. 2 shows the diode with the supporting member removed from the lead in order to understand this structure. Figure (a) in each figure is the front view and (b) is the side view.

According to FIGS. 1 and 2, a light-emitting diode 10 comprises a pair of leads 20 and 30 made from metal plates; a light-emitting element 40 is anchored to the inside of a cup 21 at the top end of lead 20; a dome part 90 formed by resin molding such that light-emitting element 40 is enclosed; and a supporting member 70 that engages with lead 20.

Light-emitting element 40 is, for instance, a semiconductor element in the form of a light-emitting diode chip. The inside surface of cup 21 where light-emitting element 40 is positioned is inclined and has the effect of reflecting up the diffused light emitted from light-emitting element 40. Moreover, a top end face 91 of dome part 90 has a convex curved surface that acts as a lens for focusing the light from light-emitting element 40.

Although not illustrated, light-emitting element 40 is connected to lead 30 by a bonded metal wire that is not illustrated. In another case, depending on the structure of light-emitting element 40, lead 20 and light-emitting element 40 are connected by wire bonding.

The pair of leads 20 and 30 electrically connected to light-emitting element 40 comprises surface mounting-type connecting parts 25 and 35 that extend from the base ends of dome part 90 and connect with an outside circuit substrate 12 shown in dashed lines in FIG. 1. Connecting parts 25 and 35 include legs 26 and 36 that extend in a perpendicular direction and connecting ends 27 and 37 at the bottom ends thereof. Connecting parts 25 and 35 form the metal plate surfaces that are the same as the primary parts positioned inside dome part 90 without being bent. Moreover, connecting ends 27 and 37 have long thin parts extending horizontally and are made so that the edges of the metal plates at these long thin parts face the circuit substrate 12 on which light-emitting diode 10 will be mounted.

Supporting member 70 works with leads 20 and 30 such that when light-emitting diode 10 is mounted on a circuit substrate 12, light-emitting diode 10 is supported with stability on the circuit substrate 12 during reflow, and during other steps. As is clear from FIGS. 1 and 2, by means of the present embodiment, supporting member 70 is made from a metal and engages and extends to intersect with lead 20. As a result, light-emitting diode 10 aligned with a pre-determined pad (not illustrated) on the circuit substrate 12 is supported at four points by leads 20 and 30 and supporting member 70. Furthermore, supporting member 70 can also be produced from a resin rather than a metal when it is not necessary to take into consideration the effect of heat radiation that will be discussed later.

As with leads 20 and 30, supporting member 70 comprises at the bottom thereof surface mounting-type connecting parts 75 that comprise a pair of legs 76 and connecting ends 77 at the tips of the legs. As with connecting ends 27 and 37, connecting ends 77 are made such that they touch pads on a circuit substrate 12 along the edges of the metal sheets that form these ends. Connecting parts 75 can be soldered and connected to a circuit substrate 12 by the same reflow technique, and similar processes that are used to connect connecting parts 25 and 35 to the circuit substrate 12. Light-emitting element 40 is directly anchored to lead 30 to which supporting member 70 is anchored as in the present embodiment therefore, the heat generated by light-emitting element 40 escapes through supporting member 70 to the circuit substrate 12, or to the outside from the part of the supporting member on the base side of dome part 90. It is not always necessary to connect the connecting part 75 portion of the supporting member to the circuit substrate 12; light-emitting diode 10 can be supported by simply contacting the circuit substrate 12.

In order to realize an authentic surface-mounted connection with leads 20 and 30 and connecting parts 25, 35, and 75 of supporting member 70, it is preferred that connecting ends 27, 37, and 77 thereof be placed virtually exactly on one plane within a predetermined allowance. Consequently, supporting member 70 must be anchored to lead 20 at least with connecting parts 25, 35, and 75 accurately positioned.

By means of the present embodiment, slots 22 and 72 are made in lead 20 and supporting member 70, respectively, as a means for joining the lead and the supporting member; the slots hold the metal sheet surfaces of the lead and the supporting member, resulting in mechanical engagement in an intersecting state, as shown in FIG. 2. By means of this engagement means, connecting end 27 of lead 20 and connecting end 77 of supporting member 70 are aligned precisely at least in the direction of height. Furthermore, welding, soldering, and the like can be used for the engaged portion when a stronger joint is needed between lead 20 and supporting member 70.

It is necessary to prevent electrical short circuiting at least between lead 30 and supporting member 70 or lead 20 when soldering light-emitting diode 10 to a circuit substrate. Therefore, connecting end 77 of supporting member 70 and connecting ends 27 and 37 of leads 20 and 30 do not project close to one another (as do leads 120 and 130 in the second embodiment).

By means of the present embodiment, the resin for dome part 90 is molded above supporting member 70 such that supporting member 70 extends inside dome part 90. In this case, it is preferred that there be a reinforcing means for mechanically strengthening the joint between supporting member 70 and the resin. This reinforcing means is realized by the present embodiment with a concave part 73 on the inside of which the resin can be held.

FIG. 3 is a drawing showing a second preferred embodiment of the light-emitting diode of the present invention. Figure (a) is a front view and (b) is a side view.

As with the first embodiment, a light-emitting diode 110 comprises a pair of leads 120 and 130; a light-emitting element 140 that is positioned inside a cup 121 at the top end of lead 120 and is electrically connected to lead 120; and a dome part 190 that is obtained by resin molding to enclose the top ends of leads 120 and 130. Moreover, leads 120 and 130 have connecting parts 125 and 135 that extend to the base side of dome part 190 and these connecting parts are made within one plane as the primary metal plate surface of leads 120 and 130 positioned inside dome part 190. Connecting parts 125 and 135 comprise legs 126 and 136 near dome part 190 and connecting ends 127 and 137 wherein the metal edges serve as the connecting faces for surface mounting.

Light-emitting diode 110 of the second embodiment differs from the first embodiment in that it comprises a ring-shaped supporting member 170, in place of a plate-shaped supporting member, which engages with the leads.

Figure 4:
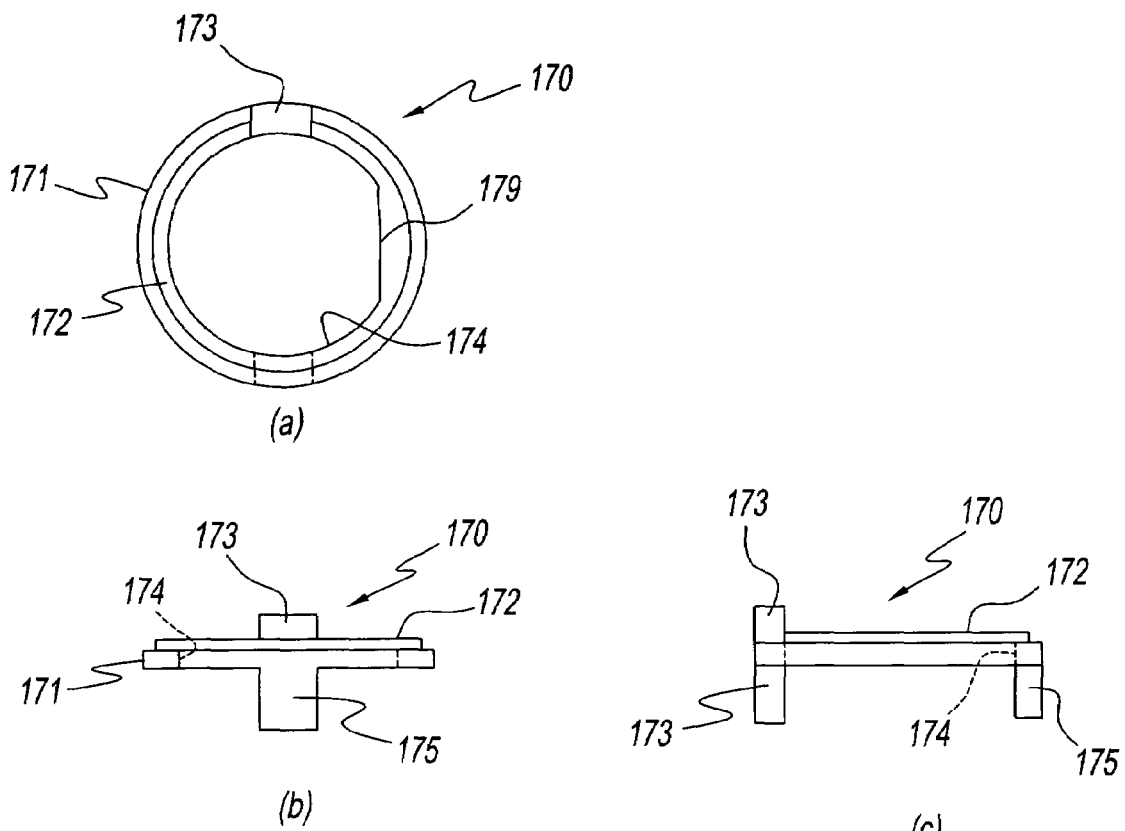
FIG. 4 is a drawing showing the supporting member of a second embodiment of the present invention, and (a) is the plane view, (b) is the front view, and (c) is the side view.

FIG. 4 is a drawing showing the supporting member of the second embodiment of the present invention. Figure (a) is the plane view, (b) is the front view, and (c) is the side view. Supporting member 170 comprises a ring-shaped body 171 with an opening 174; a step part 172 that projects up slightly inside body 171; legs 175 that project toward the base at a position facing body 171; and a tongue 173 projecting up from body 171 in one place. Moreover, an overhang part 179, for instance, for differentiating between anodes and cathodes (cathode marks), and the like, is made in part of opening 174. The shape or color of the supporting member can be used as marking that can provide other information except differentiation of electrodes.

Supporting member 170 is anchored at the base of dome part 190, as shown in FIG. 3. Supporting member 170 is bonded facing the resin of dome part 190 along the base end of dome part 190. In further detail, supporting member 170 is placed facing the resin when dome part 190 is molded and is anchored to dome part 190 as the resin solidifies.

A material that has good adhesion with the resin that forms dome part 190 and is heat resistant is selected as the material for supporting member 170. For example, it can be made of PPA (polyphthalamide) or another resin, or aluminum or another metal. Various conventional methods for modifying surface character can be used for improving adhesion with the resin of dome part 190.

Leads 120 and 130 are placed so that they pass through opening 174 during the resin molding step. A step part 172 that projects above body 171 is introduced into the molding cup during molding and engages with the cup such that supporting member 170 is aligned with the axis of the light-emitting diode. The outside of tongue 173 engages with a groove of a complementary shape that has been made in the molding cup and the supporting member is aligned in the direction of rotation. Thus, the height of connecting ends 127 and 137 of leads 120 and 130 and the base end of leg 175 can be aligned with the completed light-emitting diode 110 by using step part 172 and tongue 173 that have complementary shapes that will engage with the molding cup.

Once the resin has solidified, the end of tongue 173 will extend to inside dome part 190 and act such that it reinforces the joint in the direction of rotation between supporting member 170 and dome part 190. Overhang part 179, which makes opening 140 asymmetric with respect to the center axis, also can have the effect of improving the mechanical joint strength in the direction of rotation.

Thus, the height of leads 120 and 130 is aligned; therefore, the base end of leg 175 forms almost exactly one plane with connecting ends 127 and 137 of connecting parts 125 and 135 when supporting member 170 is in an anchored state. Consequently, light-emitting diode 110 is supported with sufficient stability by both connecting parts 125 and 135 of leads 120 and 130 and the pair of legs 175 of supporting member 170 when the light-emitting diode is placed on the circuit substrate by the reflow step or another technique for surface-mounted connection.

A projection that engages with a through-hole or concave part in a circuit substrate (not illustrated) can also be made in at least one of the base ends of legs 175 as an aligning means. Moreover, if the shape of the supporting member is changed and a wall that is near the base end of the dome part is made such that opening 174 becomes sufficiently small and at least the top surface of the wall is colored black, or another color, the black can be seen from the top of the dome part when the light-emitting element is not emitting light; therefore, contrast between states where the light-emitting element is on and off can be improved.

Figure 5:
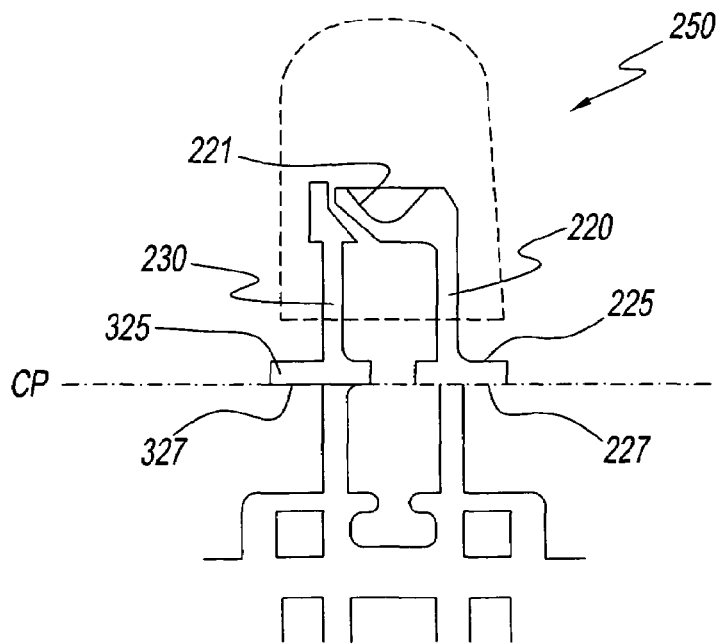
FIG. 5 is a drawing showing one unit of the lead frame during the production steps.

FIG. 5 is a drawing showing a single-unit lead frame during the production steps as it relates to the leads used in the first and second embodiments. A unit 250 comprises a pair of leads 220 and 230. That is, leads 220 and 230 correspond to the first embodiment and leads 120 and 130 correspond to the second embodiment.

The basic steps involved in the production of first and second light-emitting diodes 10 and 110 are the following: a step for producing a lead frame comprising a plurality of units 250 by die cutting a metal plate; a step for forming a cup 221 by pressing each unit in the lead frame to lead 220; a step for anchoring a light-emitting element inside cup 221; a step for electrically connecting the light-emitting element and the pair of leads; a step for resin molding a dome part that encloses the light-emitting element; a step for anchoring the supporting member; and a step for cutting each unit from the lead frame.

In particular, the production of light-emitting diode 10 in the first embodiment involves anchoring supporting member 70 to lead 20 before molding of dome part 20. This anchoring is realized by mechanical engagement or mechanical engagement and welding or another means, as previously mentioned. On the other hand, light-emitting diode 110 of the second embodiment is produced at the same time as dome part 190 is formed, as previously described.

FIG. 5 shows the cutting position CP for producing the final product. It is clear that metal plate parts extending horizontally are formed and surface mounting-type connecting parts 225 and 325 are made with the leads of these metal plates serving as connecting ends 227 and 327 directly above the cutting positions of leads 220 and 230. Surface mounting-type connecting parts 225 and 325 of leads 220 and 230 can be easily produced without special means.

Figure 6:
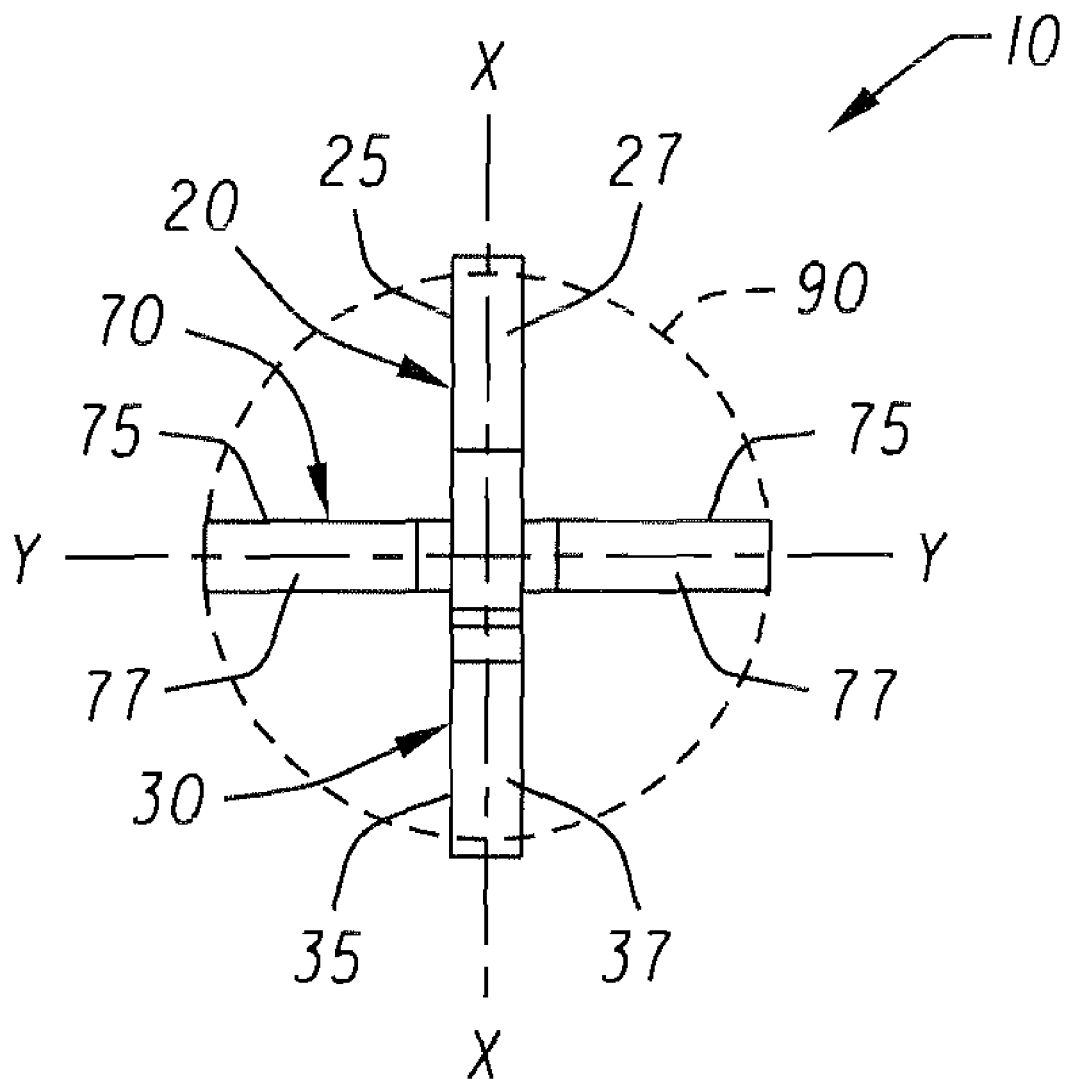
FIG. 6 is a drawing showing a bottom view of the light-emitting embodiment shown in FIGS. 1 and 2, with the circuit substrate removed for clarity and the dome part shown in dashed lines.

FIG. 6 is a drawing showing a bottom view of the light-emitting diode 10 of FIG. 1, with the circuit substrate 12 (FIG. 1) removed for clarity and the dome part 90 shown in dashed lines. With reference to FIGS. 1, 2 and 6, the horizontal edges 27 and 37 of the surface-mounting connecting parts 25 and 35 of the pair of leads 20 and 30 extend in a first direction along axis "XX" away from the light-emitting diode 40 (FIGS. 1 and 2). The horizontal edges 77 of the surface-mounting connecting parts 75 of the supporting member 70 extend in a second direction along axis "YY" away from the light-emitting diode 40. Axes "XX" and "YY" are substantially perpendicular to one another and are both oriented on a plane "XYXY" that lies on the surface of the circuit substrate 12 (FIG. 1). In this manner, the light-emitting diode 10 is supported at four points on the circuit substrate 12 by leads 20 and 30 and supporting member 70 as discussed above relative to FIGS. 1 and 2.

Preferred embodiments of the structure and method for producing the light-emitting diode of the present invention have been described in detail, but these are only examples and further modifications and changes are possible by persons skilled in the art.

For instance, the following structures can be realized as other modifications:

(1) A structure wherein the supporting member and leads are coupled outside of the dome part In this case, the leads and supporting member can be anchored by mechanical engagement and welding or other means after the dome part has been resin molded.

(2) A structure wherein a supporting member made from an insulator is engaged with both of leads of the pair of leads.

A supporting member can be anchored to both leads before or after the dome part has been molded. Insert molding to the metal plate leads can also be performed to form a supporting member that has been pre-anchored to a metal plate lead.

(3) A structure wherein a metal supporting member is formed as one unit with the lead In order to guarantee reliability of operation of light emitting diode, a supporting means for a light-emitting diode can be provided by bending and forming a metal plate to be intersected with the leads before the dome part is molded and preferably before the light-emitting element has been anchored.

What is claimed is:

1. A surface mounting-type light-emitting diode mountable on a surface of a circuit substrate, comprising:
    a pair of metal plate leads connected at a first end to a light-emitting element, a second end of each of the pair of metal plate leads comprising a surface mounting-type connecting part having a horizontal edge that contacts the surface of the circuit substrate, wherein each horizontal edge of the pair of metal plate leads is oriented along a plane that lies on the surface of the circuit substrate and extends along the plane in a first direction away from the light-emitting diode; and
    a supporting member having at least one pair of surface mounting-type connecting parts each having a horizontal edge oriented along the plane that also contacts the surface of the circuit substrate, wherein each horizontal edge of the supporting member extends along the plane in a second direction away from the light-emitting diode, and wherein the second direction is substantially perpendicular to the first direction.

2. The light-emitting diode according to claim 1, wherein said supporting member engages with at least one lead of the pair of metal plate leads.

3. The light-emitting diode according to claim 2, wherein a light-emitting element is disposed on one of the pair of metal plate leads and said supporting member is made from a metal plate that is anchored to the one of the pair of metal plate leads.

4. The light-emitting diode according to claim 1, wherein the supporting member and at least one of the pair of metal plate leads comprise mechanical engagement means for determining the height of the supporting member and the pair of metal plate leads.

5. The light-emitting diode according to claim 1, wherein said light-emitting diode comprises a resin dome part having a base end and enclosing the light-emitting element and down to near the ends of the pair of metal plate leads, and the supporting member is anchored to the base end of the resin dome part.

6. The light-emitting diode according to claim 5, wherein said supporting member comprises engaging means for engaging with a molding cup used to mold the resin dome part such that at least rotational movement is prevented, and the supporting member is anchored by molding.

7. The light-emitting diode according to claim 5, wherein said supporting member is made from insulating material.

* * * * *